United States Patent
Yokoyama et al.

(10) Patent No.: US 10,879,468 B2
(45) Date of Patent: *Dec. 29, 2020

(54) COMPOSITION, ORGANIC PHOTOELECTRONIC ELEMENT, AND PRODUCTION METHOD THEREFOR

(71) Applicants: National University Corporation Yamagata University, Yamagata (JP); AGC Inc., Chiyoda-ku (JP)

(72) Inventors: Daisuke Yokoyama, Yonezawa (JP); Takefumi Abe, Chiyoda-ku (JP); Yasuhiro Kuwana, Chiyoda-ku (JP)

(73) Assignees: National University Corporation Yamagata University, Yamagata (JP); AGC Inc., Chiyoda-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/431,113

(22) Filed: Jun. 4, 2019

(65) Prior Publication Data

US 2019/0305226 A1   Oct. 3, 2019

Related U.S. Application Data

(63) Continuation of application No. PCT/JP2017/044770, filed on Dec. 13, 2017.

(30) Foreign Application Priority Data

Dec. 14, 2016 (JP) .................................. 2016-242466
Aug. 24, 2017 (JP) .................................. 2017-161636

(51) Int. Cl.
*H01L 51/00* (2006.01)
*C08L 27/18* (2006.01)
(Continued)

(52) U.S. Cl.
CPC .......... *H01L 51/0043* (2013.01); *C08L 27/18* (2013.01); *C08L 27/20* (2013.01);
(Continued)

(58) Field of Classification Search
CPC . H01L 51/0043; H01L 51/50; H01L 51/5012; H01L 51/5056; C08L 27/18; C08L 27/20; H05B 33/10
See application file for complete search history.

(56) References Cited

U.S. PATENT DOCUMENTS

2005/0196969 A1* 9/2005 Gunner ................. G03F 7/0387
                                                                        438/725
2007/0114919 A1   5/2007 Sotoyama
(Continued)

FOREIGN PATENT DOCUMENTS

JP   2006-237083   9/2006
JP   2007-141736   6/2007
(Continued)

OTHER PUBLICATIONS

International Search Report dated Mar. 20, 2018 in PCT/JP2017/044770 filed Dec. 13, 2017 (with English Translation).
(Continued)

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

To provide a layer such as a charge transport layer having a refractive index significantly lowered without impairing electrical conductivity and surface roughness, and a method for producing it. A deposited film composition obtained by co-depositing a fluorinated polymer having a saturated vapor pressure at 300° C. of at least 0.001 Pa and an organic semiconductor material.

14 Claims, 5 Drawing Sheets

(51) Int. Cl.
*C08L 27/20* (2006.01)
*H01L 51/50* (2006.01)
*H05B 33/10* (2006.01)

(52) U.S. Cl.
CPC .......... *H01L 51/50* (2013.01); *H01L 51/5012* (2013.01); *H01L 51/5056* (2013.01); *H05B 33/10* (2013.01); *C08F 2500/02* (2013.01); *C08F 2500/03* (2013.01); *C08L 2203/20* (2013.01)

(56) References Cited

U.S. PATENT DOCUMENTS

| | | | |
|---|---|---|---|
| 2008/0233503 A1* | 9/2008 | Wu | G03G 5/047 430/58.8 |
| 2008/0241721 A1* | 10/2008 | Yuh | G03G 5/10 430/58.8 |
| 2012/0052426 A1* | 3/2012 | Qi | G03G 5/0514 430/58.5 |
| 2018/0366650 A1 | 12/2018 | Yokoyama et al. | |
| 2019/0288205 A1* | 9/2019 | Abe | G09F 9/30 |

FOREIGN PATENT DOCUMENTS

| | | |
|---|---|---|
| JP | 2008-280506 | 11/2008 |
| WO | 2004/068912 | 8/2004 |
| WO | WO 2016/043084 A1 | 3/2016 |
| WO | WO 2016/204275 A1 | 12/2016 |

OTHER PUBLICATIONS

Kanchan Saxena, et al. "A review on the light extraction techniques in organic electroluminescent devices", Optical Materials 32(1), 2009, 13 pages.

Daisuke Yokoyama, "Molecular orientation in small-molecule organic light-emitting diodes", Journal of Materials Chemistry, 21, 2011, 16 pages.

* cited by examiner

COMPOSITION, ORGANIC PHOTOELECTRONIC ELEMENT, AND PRODUCTION METHOD THEREFOR

TECHNICAL FIELD

The present invention relates to a composition, an organic photoelectronic element, and production methods therefor.

BACKGROUND ART

Of an organic photoelectronic element such as an organic electroluminescence element (hereinafter referred to as "organic EL element"), the internal quantum efficiency has already reached almost 100%, and in order to further improve the external quantum efficiency, an improvement of the light-extraction efficiency is desired. The light-extraction efficiency of an organic EL element remains usually at a level of from 20 to 30%, and its improvement is greatly expected. To improve the light-extraction efficiency, for example, a technique to impart a very fine microlens to the substrate surface, a technique to microfabricate the substrate surface, a technique to use a high refractive index substrate, and a technique to let a scattering substance be present between a transparent substrate and a transparent electrode, etc., have been known (Patent Document 1 and Non-Patent Document 1).

PRIOR ART DOCUMENTS

Patent Document

Patent Document 1: WO2016/043084

Non-Patent Documents

Non-Patent Document 1: K. Saxena et al., Opt. Mater. 32(1), 221-233, (2009)
Non-Patent Document 2: D. Yokoyama, J. Mater. Chem. 21, 19187-19202 (2011)

DISCLOSURE OF INVENTION

Technical Problem

However, both the techniques disclosed in Patent Document 1 and Non-Patent Document 1 require an expensive member or complicate an element preparation process and remarkably increase the production cost. As a means not to increase the production cost, in recent years, a technique to make use of horizontal orientation property of light-emitting molecules in an organic EL element thereby to improve the light-extraction efficiency by several tens percent has been widely employed (Non-Patent Document 2), however, the light extraction efficiency should still be significantly improved, and its improvement is expected.

The essential reason why the light-extraction efficiency of an organic photoelectronic element such as an organic EL element is low is that the refractive index of an organic semiconductor material constituting a luminous layer and a charge transport layer is high. If the refractive index on the light-emitting side is high, light is lost by total reflection at an interface having a different refractive index, whereby the light-extraction efficiency is lowered. An organic semiconductor material mainly used for an organic EL element usually has a refractive index (from about 1.7 to about 1.8) lower than that of an inorganic semiconductor commonly used for an LED, however, the light-extraction efficiency still remains at the above value. Accordingly, it has been strongly desired to use an organic semiconductor material having a further lower refractive index.

An organic photoelectronic element is usually in the form of a multi-layered structure comprising an organic semiconductor film (e.g. a charge transport layer) of 100 nm or thinner and a pair of metal electrodes, and smooth charge transport at each interface greatly influences the performance of the element, and thus it is required to form smooth interface and surface at the nanometer level.

The present invention has been made under the above circumstances, and it provides a charge transport layer having a refractive index significantly lowered without impairing the electrical conductivity and the surface roughness of the charge transport layer, an organic photoelectronic element using it, and an inexpensive and simple method for producing it.

Solution to Problem

The present invention provides the following.
[1] A deposited film composition obtained by co-depositing a fluorinated polymer having a saturated vapor pressure at 300° C. of at least 0.001 Pa and an organic semiconductor material.
[2] The composition according to [1], wherein the volume ratio of the fluorinated polymer to the organic semiconductor material is from 70:30 to 5:95.
[3] The composition according to [1] or [2], wherein the fluorinated polymer has a weight average molecular weight of from 1,500 to 50,000.
[4] The composition according to any one of [1] to [3], wherein the dispersity (Mw/Mn) of the fluorinated polymer is at most 2.
[5] The composition according to any one of [1] to [4], wherein the fluorinated polymer has an alicyclic structure in its main chain.
[6] The composition according to [5], wherein the fluorinated polymer having an alicyclic structure in its main chain is a perfluoropolymer.
[7] The composition according to any one of [1] to [6], which has a refractive index in a wavelength range of from 450 nm to 800 nm of at most 1.60.
[8] The composition according to any one of [1] to [7], wherein the fluorinated polymer has a refractive index in a wavelength range of from 450 nm to 800 nm of at most 1.50.
[9] The composition according to any one of [1] to [8], which has an absorption coefficient in a wavelength range of from 450 nm to 800 nm of at most 1,000 cm$^{-1}$.
[10] A method for producing the deposited film composition as defined in any one of [1] to [9], which comprises co-depositing the fluorinated polymer and the organic semiconductor material.
[11] An organic photoelectronic element having a layer comprising the deposited film composition as defined in any one of [1] to [9].
[12] The organic photoelectronic element according to [11], wherein the photoelectronic element is an organic EL element.
[13] A method for producing a layer of the deposited film composition as defined in any one of [1] to [9], which comprises co-depositing the fluorinated polymer and the organic semiconductor material on a substrate.
[14] A method for producing the organic photoelectronic element as defined in [10] or [11], which comprises a step of co-depositing the fluorinated polymer and the organic semiconductor material to form the layer of the deposited film composition.

[15] The method according to [14], wherein the organic photoelectronic element is an organic EL element, and the layer of the deposited film composition is a charge transport layer.

Advantageous Effects of Invention

According to the deposited film composition and the organic photoelectronic element of the present invention, the light-extraction efficiency of the organic photoelectronic element such as an organic EL element improves.

According to the method for producing the deposited film composition and the method for producing a layer containing the deposited film composition of the present invention, it is possible to inexpensively and easily produce an organic photoelectronic element having an improved light-extraction efficiency such as an organic EL element.

According to the method for producing an organic photoelectronic element of the present invention, it is possible to produce an organic photoelectronic element having an improved light-extraction efficiency.

DESCRIPTION OF EMBODIMENTS

Figure 1:
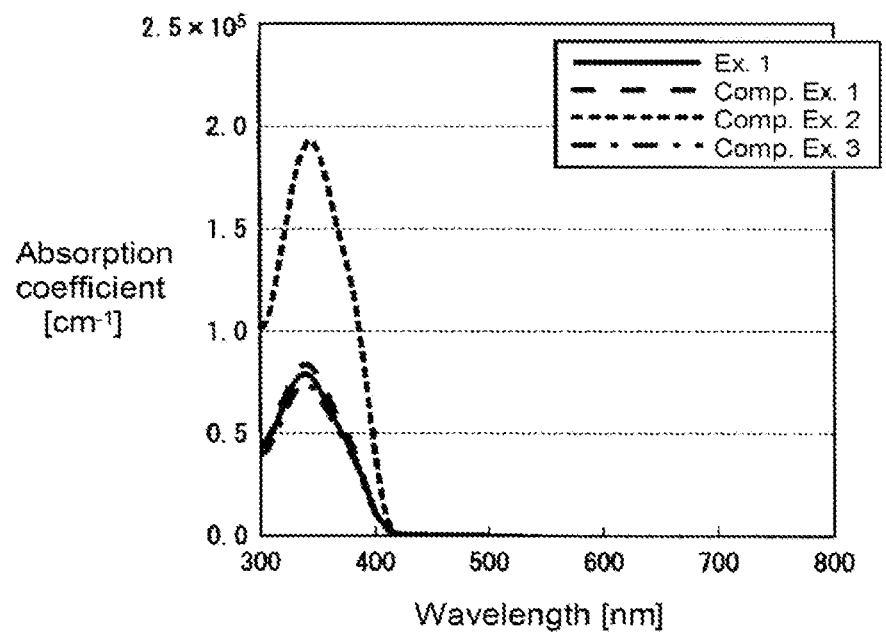
FIG. 1 is a graph illustrating absorption spectra of the films in Example 1 and Comparative Examples 1 to 3.
Figure 2:
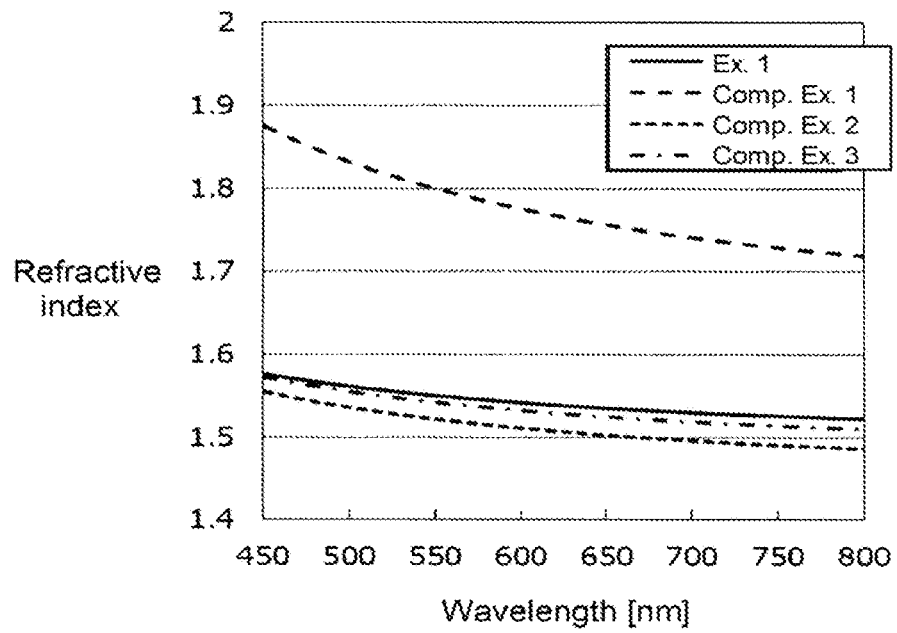
FIG. 2 is a graph illustrating the dependence of the refractive index on the wavelength of the films in Example 1 and Comparative Examples 1 to 3.
Figure 3:
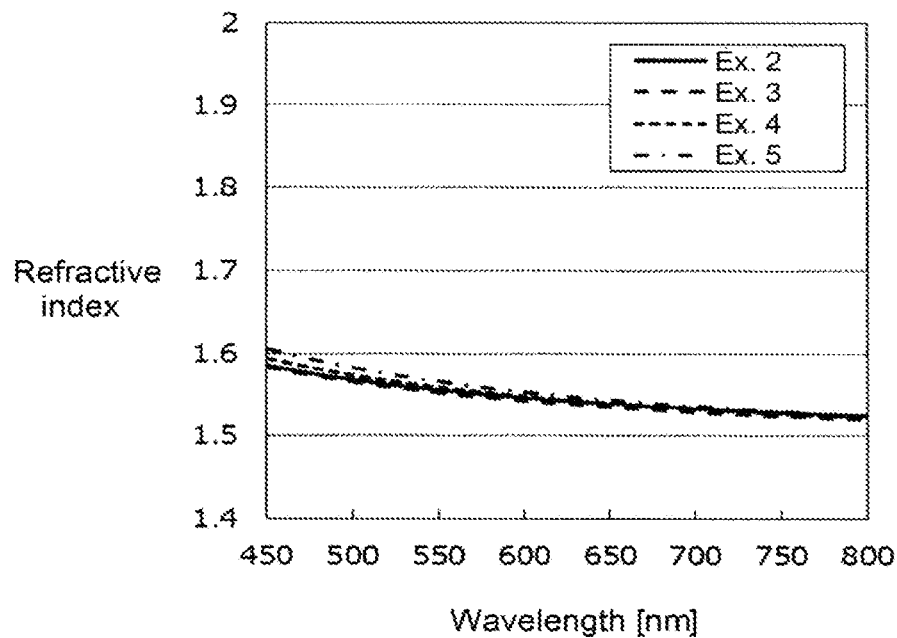
FIG. 3 is a graph illustrating the dependence of the refractive index on the wavelength of the films in Examples 2 to 5.
Figure 4:
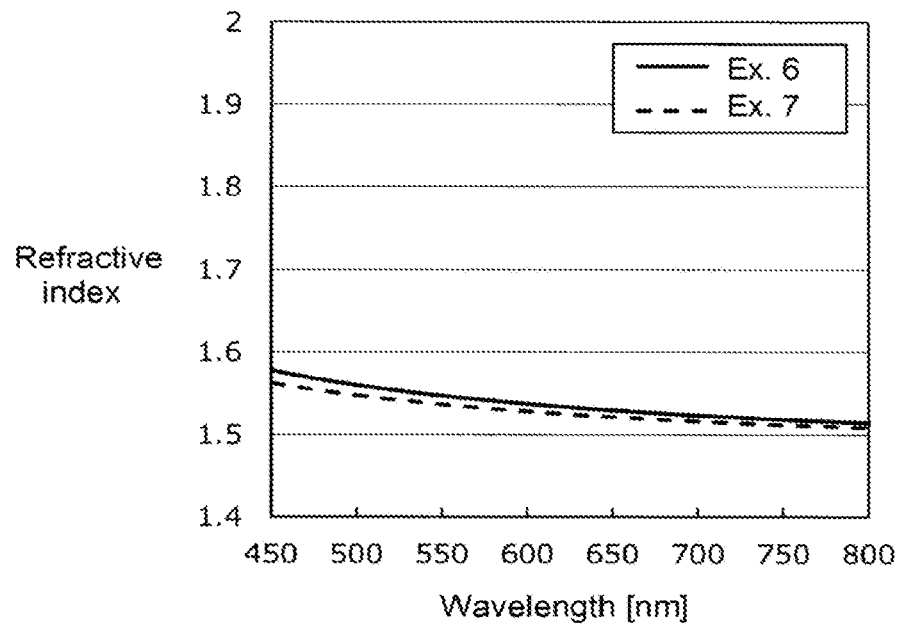
FIG. 4 is a graph illustrating the dependence of the refractive index on the wavelength of the films in Examples 6 and 7.
Figure 5:
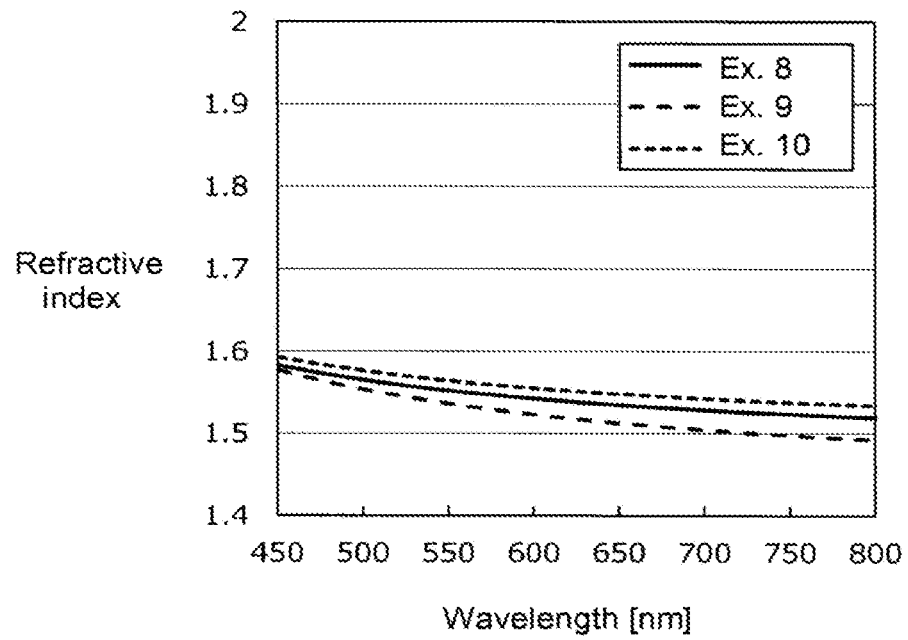
FIG. 5 is a graph illustrating the dependence of the refractive index on the wavelength of the films in Examples 8 to 10.
Figure 6:
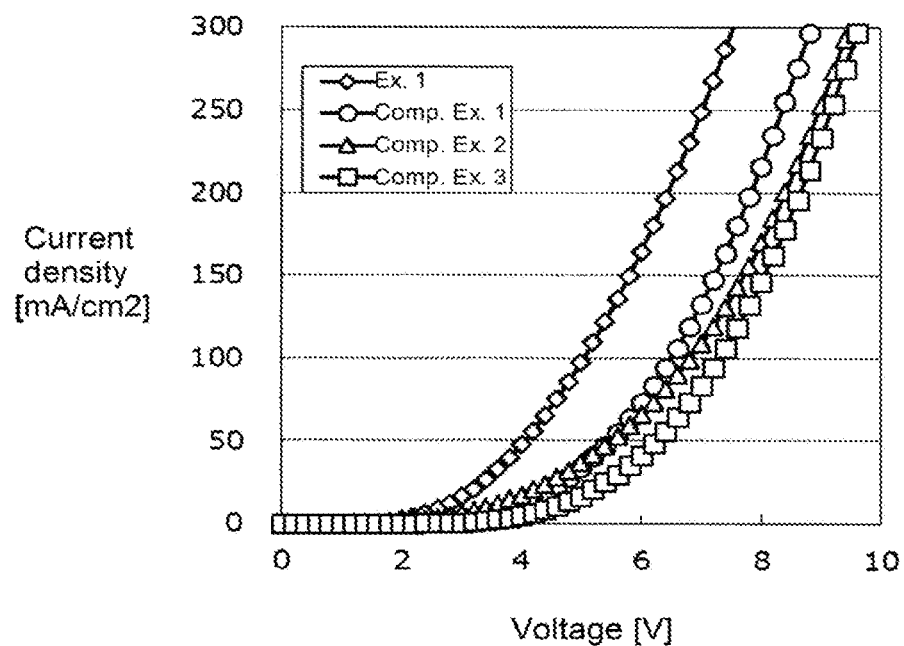
FIG. 6 is a graph illustrating J (current)-V (voltage) characteristics of the films in Example 1 and Comparative Examples 1 to 3.
Figure 7:
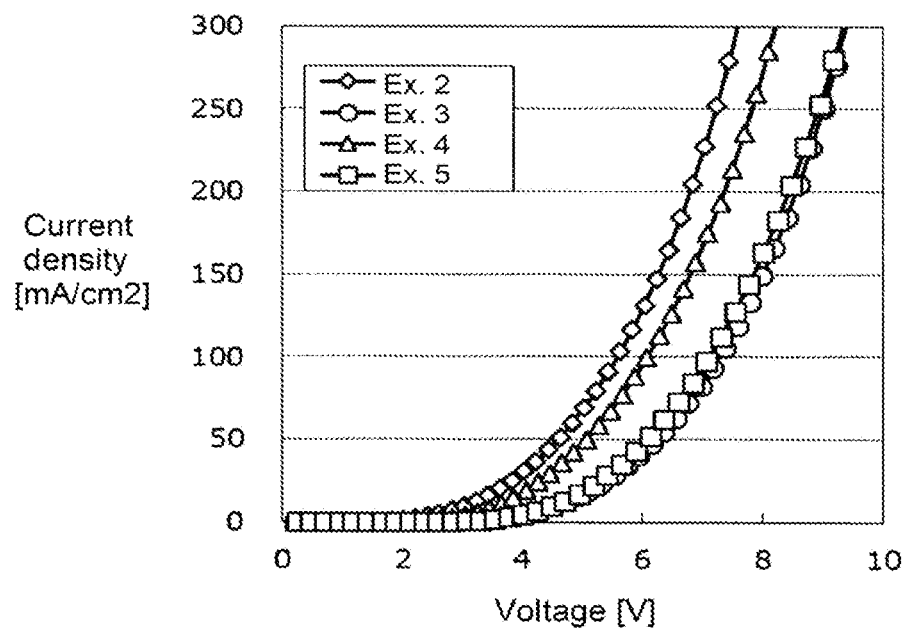
FIG. 7 is a graph illustrating J (current)-V (voltage) characteristics of the films in Examples 2 to 5.
Figure 8:
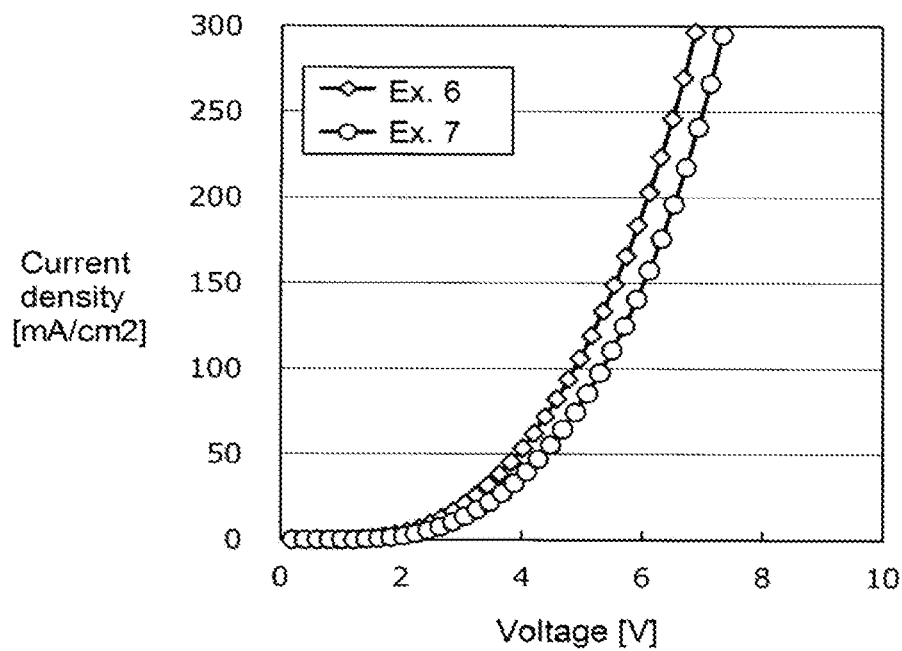
FIG. 8 is a graph illustrating J (current)-V (voltage) characteristics of the films in Examples 6 and 7.
Figure 9:
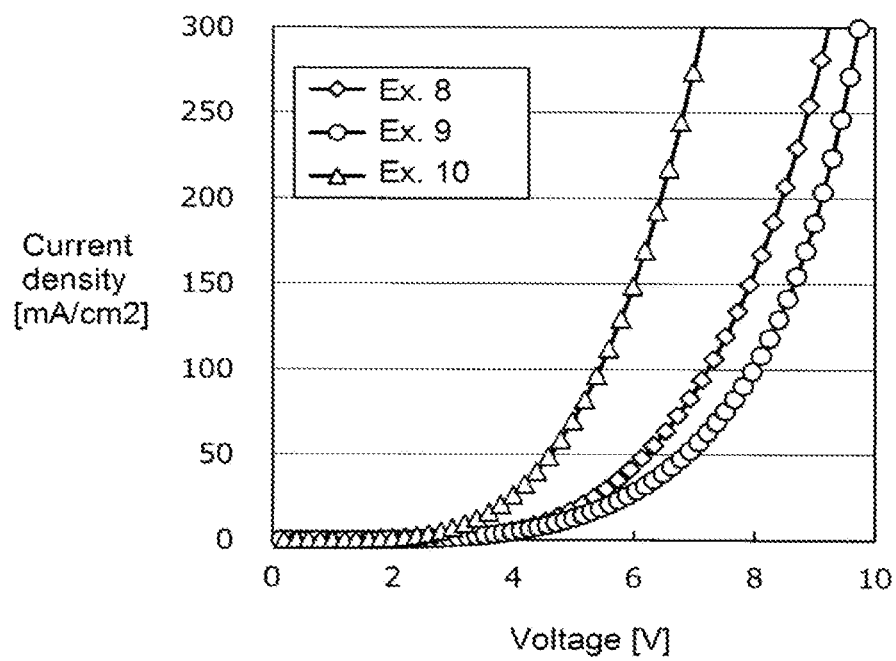
FIG. 9 is a graph illustrating J (current)-V (voltage) characteristics of the films in Examples 8 to 10.

The deposited film composition of the present invention is obtained by co-depositing a fluorinated polymer having a saturated vapor pressure at 300° C. of at least 0.001 Pa and an organic semiconductor material.

Hereinafter, the "fluorinated polymer" means a fluorinated polymer before deposition used for co-deposition, unless otherwise specified. In a case where a fluorinated polymer before deposition and a fluorinated polymer in the deposited film after deposition should be distinguished, hereinafter, the later will be referred to as a "fluorinated polymer in the deposited film", a "deposited fluorinated polymer", etc.

The fluorinated polymer in the present invention is a polymer containing fluorine atoms. In the present invention, an oligomer is included in a polymer. That is, the fluorinated polymer may be an oligomer. From the viewpoint of the rate of formation of the deposited film layer such as a charge transport layer, and the strength and the surface roughness of the deposited film layer, the fluorinated polymer preferably has a saturated vapor pressure sufficient to be practically used at a temperature at which the heat decomposition of the fluorinated polymer occurs or lower. The thermal decomposition starting temperature of PTFE which is a common fluorinated polymer is about 400° C., and the heat decomposition starting temperature of Teflon (registered trademark) AF is 350° C. The saturated vapor pressure of the fluorinated polymer of the present invention at 300° C. is at least 0.001 Pa, preferably at least 0.002 Pa. From such a viewpoint, the fluorinated polymer is preferably one having an alicyclic structure in its main chain, which is considered to have low crystallinity. Further, more preferred is a perfluoropolymer, which is considered to have small intermolecular interaction of the polymer.

In this specification, the saturated vapor pressure (unit: Pa) is a value measured by vacuum thermovalance (manufactured by ADVANCE RIKO, Inc., VAP-9000).

In addition to the saturated vapor pressure, as a parameter of evaporability of the fluorinated polymer, the evaporation rate may be employed. The evaporability of the fluorinated polymer having a saturated vapor pressure at 300° C. of at least 0.001 Pa corresponds to an evaporation rate at 300° C. at a degree of vacuum of 0.001 Pa of at least 0.01 g/m$^2$·sec.

Mw of the fluorinated polymer is preferably from 1,500 to 50,000, more preferably from 3,000 to 40,000, further preferably from 5,000 to 30,000. When Mw is at least 1,500, the deposited film to be formed tends to have sufficient strength. On the other hand, when Mw is at most 50,000, such a fluorinated polymer has a saturated vapor pressure which imparts practical deposited film forming rate (film deposition rate), and accordingly it is not necessary to heat the deposition source to high temperature, specifically a temperature higher than 400° C. If the temperature of the deposition source is too high, the main chain of the fluorinated polymer will cleave in the deposition step, the fluorinated polymer tends to have a low molecular weight, and the deposited film to be formed tends to have insufficient strength and further defects derived from decomposed products will form, whereby a smooth surface is hardly obtained. Further, unintentionally included molecules or ions formed by cleavage of the main chain may influence the electrical conductivity of the film, and in such a case, it may be difficult to control the electrical conductivity of the deposited film.

Accordingly, when Mw is within a range of from 1,500 to 50,000, a deposited film having sufficient strength and a smooth surface will be formed without cleavage of the main chain of the fluorinated polymer. In an organic EL element, the surface roughness of a deposited film such as a charge transport layer is an important factor, and when the deposited film has a smooth surface, charge transport at the interface will be smoothly conducted, and problems such as leak current, device defects, and a decrease of electricity efficiency can be avoided.

From the viewpoint of the stability of the quality of the deposited film to be formed, the dispersity (Mw/Mn) of the fluorinated polymer is preferably low, and is preferably at most 2. The theoretical lower limit of the dispersity is 1. In order to obtain a fluorinated polymer having a low dispersity, a method of conducting controlled polymerization such as living radical polymerization, a molecular weight fractionation purification method by size exclusion chromatography or a molecular weight fractionation purification method by sublimation purification may be mentioned. Among these methods, considering the stability of the deposition rate, sublimation purification is preferred.

The "dispersity" of the fluorinated polymer means a proportion of the weight average molecular weight (hereinafter referred to as "Mw") to the number average molecular weight (hereinafter referred to as "Mn"), that is, Mw/Mn. Hereinafter, the dispersity will be referred to as "Mw/Mn". In this specification, Mw and Mn are values measured by gel permeation chromatography (GPC). Mw/Mn is a value calculated from the obtained Mw and Mn.

Further, the glass transition point (Tg) of the fluorinated polymer is preferably high, whereby the reliability of the obtainable element will be high. Specifically, the glass transition point is preferably at least 60° C., more preferably at least 80° C., particularly preferably at least 100° C. The upper limit is not particularly limited and is preferably 350° C., more preferably 300° C.

In a case where the fluorinated polymer is formed into a film by deposition, the film obtained is formed by polymer molecules differing in the molecular weight as between the initial stage and the terminal stage of the deposition, due to such properties that polymer molecules having a lower molecular weight start evaporating first. In deposition, the thickness of the deposited film to be formed is controlled usually by opening and closing of e.g. a shutter placed immediately above the deposition source, and on that occasion, the molecular weight fractionation is conducted at the same time, and Mw and Mw/Mn are different between the polymer as the deposition source and the polymer in the deposited film formed.

In the present invention, Mw of the fluorinated polymer in the deposited film is preferably from 1,000 to 20,000, more preferably from 1,500 to 15,000, further preferably from 2,000 to 10,000. When Mw is at least 1,000, the deposited film will be excellent in strength and heat resistance. On the other hand, when Mw is at most 20,000, the electrical conductivity of the charge transport layer can be maintained.

Further, from the viewpoint of homogeneity of the deposited film, Mw/Mn of the fluorinated polymer in the deposited film is preferably at most 1.2, more preferably at most 1.1. When Mw/Mn is at most 1.2, the proportion of the low molecular weight polymer contained in the deposited film is low, and the deposited film will be excellent in heat resistance and have high homogeneity. Mw/Mn being at least 1.3 means a high proportion of an extremely low molecular weight polymer contained in the deposited film, and the deposited film will be inferior in heat resistance and have uneven film structure.

In a case where the perfluoropolymer having a fluorinated alicyclic structure in its main chain is a perfluoropolymer consisting solely of repeating units obtained by cyclopolymerization of perfluoro(butenyl vinyl ether), it has an intrinsic viscosity [η] of preferably from 0.01 to 0.14 dl/g, more preferably from 0.02 to 0.1 dl/g, particularly preferably from 0.02 to 0.08 dl/g. In a case where [η] is at least 0.01 dl/g, the molecular weight of the fluorinated polymer is relatively high, and the deposited film tends to have sufficient strength. On the other hand, when [η] is at most 0.14 dl/g, the molecular weight of the fluorinated polymer is relatively low, and such a fluorinated polymer will have a saturated vapor pressure and an evaporation rate which impart practical film deposition rate.

In this specification, the intrinsic viscosity [η] (unit: dl/g) is a value measured by an Ubbelohde viscometer (manufactured by SHIBATA SCIENTIFIC TECHNOLOGY LTD., viscometer Ubbelohde) at a measurement temperature of 30° C. using ASAHIKLIN (registered trademark) AC2000 (manufactured by Asahi Glass Company, Limited) as a solvent.

The upper limit of the refractive index at a wavelength of from 450 to 800 nm of the fluorinated polymer is preferably 1.5, more preferably 1.4. When the refractive index is at most 1.5, the refractive index of the deposited film layer such as a charge transport layer obtained by mixing with an organic semiconductor material can be lowered to a level of 1.55 which is at the same level as the refractive index of e.g. the glass substrate, and the light-extraction efficiency will improve. On the other hand, the theoretical lower limit of the refractive index is 1.0.

The refractive index of the organic semiconductor material is usually from about 1.7 to about 1.8. By mixing a fluorinated polymer having a refractive index of at most 1.5 with such a common organic semiconductor material, the refractive index of the charge transport layer to be obtained can be lowered. When the refractive index of the charge transport layer is lowered and becomes closer to the refractive index of e.g. a glass substrate (the refractive indices of soda lime glass and quartz glass are respectively from about 1.51 to about 1.53 and from about 1.46 to about 1.47 in the visible region) adjacent to the charge transport layer, total reflection caused at the interface between the charge layer and the glass substrate can be avoided, and the light-extraction efficiency will improve.

The "fluorinated polymer having an alicyclic structure in its main chain" means a fluorinated polymer having units having an alicyclic structure, at least one carbon atoms constituting the alicyclic ring being a carbon atom constituting the main chain. The alicyclic ring may be a ring having a hetero atom such as an oxygen atom.

Further, the "main chain" means, in the case of a polymer of a monoene having a polymerizable carbon-carbon double bond, a chain of carbon atoms derived from the two carbon atoms constituting the carbon-carbon double bond, and in the case of a polymer formed by cyclopolymerization of a cyclopolymerizable diene, a chain of carbon atoms derived from the four carbon atoms constituting the two carbon-carbon double bonds. In a copolymer of the cyclopolymerizable diene and the monoene, the main chain is constituted by the two carbon atoms of the monoene and the four carbon atoms of the diene.

Further, the perfluoropolymer means a fluorinated polymer having no hydrogen atom bonded to a carbon atom. Particularly preferred is a fluorinated polymer having a structure such that all hydrogen atoms bonded to carbon atoms are substituted by a fluorine atom.

The perfluoropolymer having a fluorinated alicyclic structure in its main chain may, for example, be a perfluoropolymer having units formed by cyclopolymerization of a cyclopolymerizable perfluorodiene, a perfluoropolymer having units formed by polymerization of a perfluoro alicyclic compound having a polymerizable double bond between carbon atoms constituting the alicyclic ring, or a perfluoropolymer having units formed by polymerization of a perfluoro alicyclic compound having a polymerizable double bond between a carbon atom constituting the alicyclic ring and a carbon atom outside the ring.

The cyclopolymerizable perfluorodiene is preferably a compound represented by the following formula (1).

$$CF_2=CF-Q-CF=CF_2 \quad (1)$$

In the formula (1), Q is a $C_{1-5}$, preferably $C_{1-3}$ perfluoroalkylene group which may be branched, which may contain an etheric oxygen atom, and in which one or more fluorine atoms may be substituted by a halogen atom other than fluorine atom. The halogen atom other than fluorine may, for example, be a chlorine atom or a bromine atom.

Q is preferably a perfluoroalkylene group containing an etheric oxygen atom. In such a case, the etheric oxygen atom in the perfluoroalkylene group may be present at one terminal of the group, may be present at both terminals of the group, or may be present between carbon atoms of the group. In view of cyclopolymerizability, it is present preferably at one terminal of the group. Further, the distance between carbon atoms bonded to the left and right sides of Q (the distance represented by the number of atoms in Q) is preferably 2 atoms (—X—X—) or three atoms (—X—X—X—) (wherein X represents a carbon atom, or a carbon atom and an oxygen atom). Specifically, more preferred is —O—C—, —O—C—C— or —O—C—O—.

As specific examples of the perfluorodiene represented by the formula (1), the following compounds may be mentioned.

$CF_2=CFOCF_2CF=CF_2$, $CF_2=CFOCF(CF_3)$
$CF=CF_2$, $CF_2=CFOCF_2CF_2CF=CF_2$,
$CF_2=CFOCF_2CF(CF_3)CF=CF_2$,
$CF_2=CFOCF(CF_3)CF_2CF=CF_2$,
$CF_2=CFOCFClCF_2CF=CF_2$,
$CF_2=CFOCCl_2CF_2CF=CF_2$,
$CF_2=CFOCF_2OCF=CF_2$, $CF_2=CFOC(CF_3)_2OCF=CF_2$, $CF_2=CFOCF_2CF(OCF_3)$
$CF=CF_2$, $CF_2=CFCF_2CF=CF_2$,
$CF_2=CFCF_2CF_2CF=CF_2$,
$CF_2=CFCF_2OCF_2CF=CF_2$.

Among the above specific examples, as preferred perfluorodienes, the following compounds may be mentioned.

$CF_2=CFOCF_2CF=CF_2$,
$CF_2=CFOCF_2CF_2CF=CF_2$, $CF_2=CFOCF(CF_3)CF_2CF=CF_2$, $CF_2=CFOCF_2OCF=CF_2$,
$CF_2=CFOC(CF_3)_2OCF=CF_2$.

A particularly preferred perfluorodiene is $CF_2=CFOCF_2CF_2CF=CF_2$ (hereinafter referred to as "perfluoro(3-butenyl vinyl ether)").

By cyclopolymerization of the perfluorodiene represented by the formula (1), units represented by the following formulae (1-1) to (1-4) are formed. Two or more types of units represented by the formulae (1-1) to (1-4) may be formed from one type of perfluorodiene. Units in which the alicyclic ring formed is a 5-membered or a 6-membered ring are likely to be formed, and particularly units having a 5-membered ring are likely to be formed.

In the respective units represented by the following formulae (1-1) to (1-4), the four carbon atoms represented by the following formulae are carbon atoms constituting the main chain. Among the four carbon atoms constituting the main chain, the two carbon atoms in the structure of the formula (1-1), the three carbon atoms in the structures of the formulae (1-2) and (1-3), and the four carbon atoms in the structure of the formula (1-4) are carbon atoms constituting the alicyclic ring.

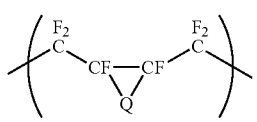

(1-1)

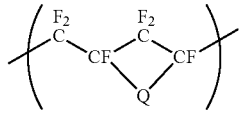

(1-2)

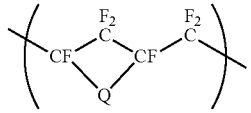

(1-3)

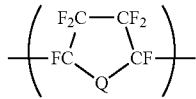

(1-4)

The perfluoro alicyclic compound having a polymerizable double bond between carbon atoms constituting the alicyclic ring is preferably perfluoro(1,3-dioxole) or its derivative. The derivative is preferably a derivative having a perfluoroalkyl group or a perfluoroalkoxy group bonded to the carbon atom in the ring. The number of carbon atoms in the perfluoroalkyl group or the perfluoroalkoxy group is preferably at most 2. As specific preferred compounds, perfluoro (2,2-dimethyl-1,3-dioxole), perfluoro(1,3-dioxole), perfluoro(4-methoxy-1,3-dioxole) and the like may be mentioned.

The perfluoro alicyclic compound having a polymerizable double bond between a carbon atom constituting the alicyclic ring and a carbon atom outside the ring, is preferably perfluoro(2-methylene-1,3-dioxolane) having a polymerizable double bond between a carbon atom constituting the ring and a carbon atom outside the ring, or its derivative. The derivative is preferably a derivative having a perfluoroalkyl group or a perfluoroalkoxy group bonded to the carbon atom in the ring. The number of carbon atoms in perfluoroalkyl group or the perfluoroalkoxy group is preferably at most 2. As specific preferred compounds, perfluoro(2-methylene-1,3-dioxolane), perfluoro(4-methyl-2-methylene-1,3-dioxolane) and the like may be mentioned.

As specific examples of the perfluoro alicyclic compound having a polymerizable double bond, compounds of the following formulae (2-1) to (2-5) are mentioned.

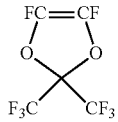

(2-1)

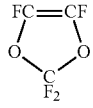

(2-2)

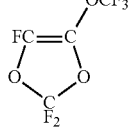

(2-3)

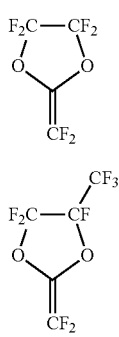

(2-4)

(2-5)

The perfluoropolymer having a fluorinated alicyclic structure in its main chain may be a homopolymer of the perfluoromonomer, or may be a copolymer obtained by copolymerizing two or more types of the perfluoromonomer. Further, it may be a copolymer of the perfluoromonomer and a perfluoromonomer not forming an alicyclic ring. In the case of the copolymer of the perfluoromonomer and a perfluoromonomer not forming an alicyclic ring, the proportion of the perfluoromonomer to the total amount of these monomers is preferably at least 20 mol %, more preferably at least 40 mol %.

The perfluoromonomer not forming an alicyclic ring may, for example, be tetrafluoroethylene, hexafluoropropylene or perfluoro(alkoxyethylene), and is preferably tetrafluoroethylene.

The fluorinated polymer in the present invention may be a fluorinated polymer other than the perfluoropolymer having a fluorinated alicyclic structure in its main chain, or may be a fluorinated polymer other than the perfluoropolymer.

Such a fluorinated polymer may be polytetrafluoroethylene (PTFE), a tetrafluoroethylene/perfluoro(alkoxyethylene) copolymer (PFA), a tetrafluoroethylene/hexafluoropropylene copolymer (FEP), an ethylene/tetrafluoroethylene copolymer (ETFE), polychlorotrifluoroethylene (PCTFE), polyvinylidene fluoride (PVdF), polyperfluoro(3-butenyl vinyl ether) (manufactured by Asahi Glass Company, Limited, CYTOP (registered trademark)), a tetrafluoroethylene/perfluoro(4-methoxy-1,3-dioxole) copolymer (manufactured by Solvay, Hyflon (registered trademark) AD), a tetrafluoroethylene/perfluoro(2,2-dimethyl-1,3-dioxole) copolymer (manufactured by Chemours (former DuPont), Teflon (registered trademark) AF) or a perfluoro(4-methyl-2-methylene-1,3-dioxolane) polymer. Among them, preferred is a perfluoropolymer having an alicyclic structure in its main chain.

The organic semiconductor material of the present invention is an organic compound material having semiconductive electrical characteristics. Organic semiconductor materials are classified into a hole transport material which transports holes injected from the anode and an electron transport material which transports electrons injected from the cathode. Both are suitably used in the present invention, and the hole transport material is particularly suitably used.

As the hole transport material, an aromatic amine derivative is suitably exemplified. As specific examples, the following α-NPD, TAPC, PDA, TPD and m-MTDATA may be mentioned, but the hole transport material is not limited thereto.

As the electron transport material, a nitrogen-containing heterocyclic derivative is suitably exemplified. As specific examples, the following Alq3, PBD, TAZ, BND and OXD-7 may be mentioned, but the electron transport material is not limited thereto.

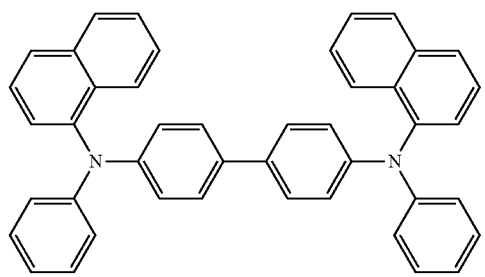

α-NPD

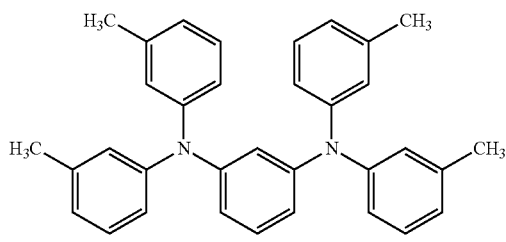

PDA

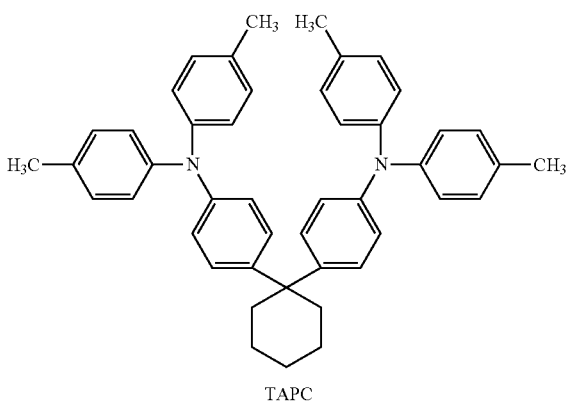

TAPC

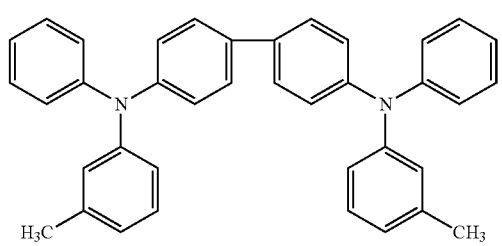

TPD

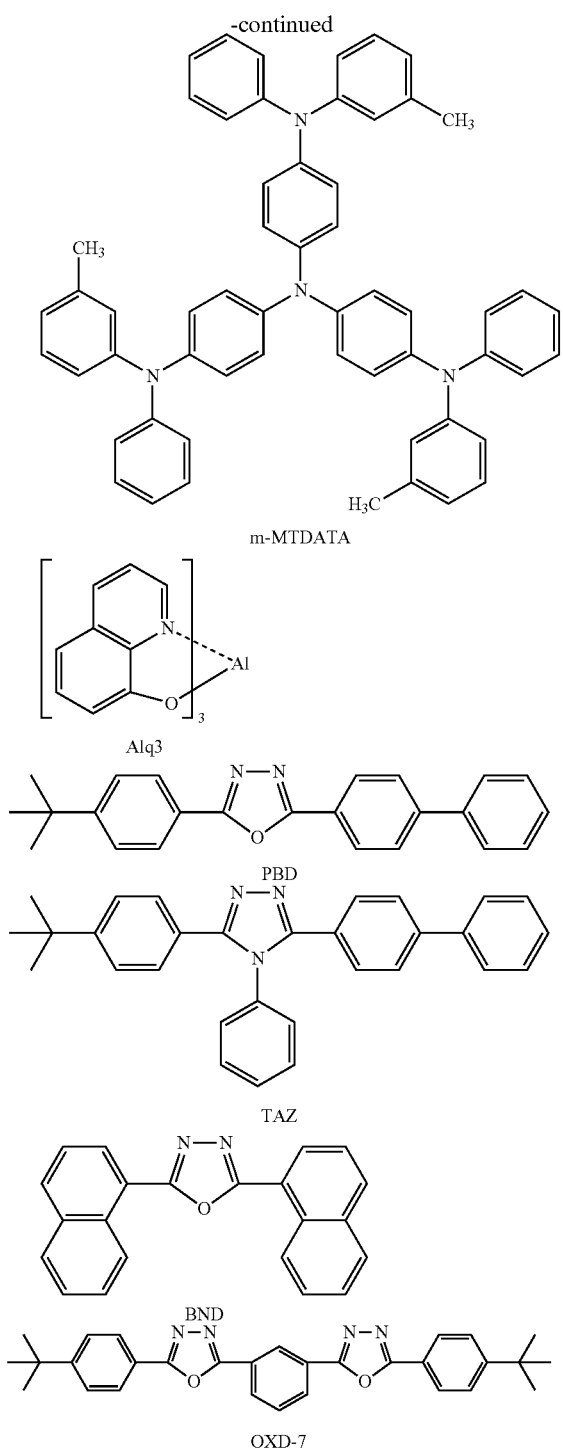

m-MTDATA

Alq3

PBD

TAZ

BND

OXD-7

The deposited film composition of the present invention may contain, in addition to the fluorinated polymer and the organic semiconductor material, other material, however, it preferably contains only the organic semiconductor material and the fluorinated polymer. The organic semiconductor material may be used alone or in combination of two or more. Further, the fluorinated polymer may be used alone or in combination of two or more.

In the deposited film composition of the present invention, the volume ratio of the fluorinated polymer to the organic semiconductor material is preferably from 70:30 to 5:95, more preferably from 60:40 to 20:80. When the volume ratio of the fluorinated polymer to the organic semiconductor material is within the above range, the refractive index of the obtainable layer will be lowered to the same level as the refractive index of e.g. a glass substrate, and the light-extraction efficiency of the organic photoelectronic element will improve.

The surface roughness of the layer comprising the deposited film composition of the present invention is preferably at most 1 nm as represented by RMS (root mean square). When the surface roughness is at most 1 nm, charge transport at an interface with the adjacent electrode, luminous layer and charge transport layer will be smoothly conducted, and the homogeneity of the electric field between layers tends to be high, whereby problems such as leak current, device defects and a decrease of electricity efficiency can be avoided.

The upper limit of the surface roughness is more preferably 0.8 nm, particularly preferably 0.6 nm. The lower limit of the surface roughness is theoretically 0 nm.

In this specification, the surface roughness (unit: nm) is a value measured in accordance with JIS B0601 by e.g. an atomic force microscope (AFM).

The thickness of layers such as the charge transport layer in the present invention is not particularly limited, and is preferably from 10 nm to 250 nm, more preferably from 20 nm to 150 nm.

The deposited film composition of the present invention has an absorption coefficient in a wavelength range of from 450 nm to 800 nm of at most 1,000 cm$^{-1}$, more preferably at most 100 cm$^{-1}$. It more preferably has no absorption band in the above wavelength range. If the absorption coefficient exceeds 1,000 cm$^{-1}$, when light passes once through a layer having a thickness of 100 nm, at least about 1% of light is absorbed based on the total amount of light before passage being 100%. In the interior of an organic EL element, by multiple interference of light, loss by light absorption when the light passes through the deposited film layer accumulates, and thus light absorption at the time of passage through the layer may remarkably reduce the light-extraction efficiency. To use a layer having sufficiently small light absorption is very important so as not to impair the light-emitting efficiency of an organic EL element. The luminous efficiency of an organic EL element will not be impaired, whereby the energy utilization efficiency will be high, and further, heat release by light absorption will be suppressed and as a result, the element life will be prolonged.

In this specification, the absorption coefficient (unit: cm$^{-1}$) is a value measured in accordance with JIS K0115.

The deposited film composition of the present invention has a refractive index in a wavelength range of from 450 nm to 800 nm of preferably at most 1.60, more preferably at most 1.55. When the refractive index is at most 1.60, the refractive index of the obtainable layer will be lowered to the same level as the refractive index of e.g. a glass substrate, and the light-extraction efficiency will improve. On the other hand, the theoretical lower limit of the refractive index of the layer of the present invention is 1.0.

The deposited film composition of the present invention preferably has electrical characteristics at the same level as those of the organic semiconductor material, whereby no significant change of the circuit design around the periphery of the element will be required. Specifically, J-V characteristics measured only with respect to the organic semiconductor material used for the deposited film composition and J-V characteristics measured in a state of the composition are preferably at the same level. More specifically, in the J-V characteristics, at an electric potential gradient of 0.7 MV/cm, the current value measured in a state of the composition is preferably at least 40%, more preferably at least 60% of the current value measured with respect to only the organic semiconductor material. The upper limit of the current value ratio is not particularly limited but is preferably at most 200%.

Even though the fluorinated polymer which is an insulating material having a volume resistivity at 25° C. in the air of at least $10^{17}$ Ω·cm is used, the composition of the present invention has electrical characteristics at the same level as those of the organic semiconductor material and also has a low refractive index, whereby the light-extraction efficiency of an organic photoelectronic element can remarkably be improved.

The present invention also provides a method for producing the deposited film composition, which comprises co-depositing the fluorinated polymer and the organic semiconductor material.

The method for producing the deposited film composition of the present invention may be carried out by a known method, and resistance heating evaporation method or electron beam evaporation method may, for example, be mentioned. Among them, co-deposition method by resistance heating is particularly preferred, whereby a film can easily be formed without decomposing the organic semiconductor and the fluorinated polymer.

The deposition rate in co-deposition (the total deposition rate of the fluorinated polymer and the organic semiconductor material) is not particularly limited, and is preferably from 0.001 to 10 nm/s, whereby the surface roughness will be within a predetermined range. On that occasion, the mixing ratio of the fluorinated polymer and the organic semiconductor material can be controlled by their deposition rate ratio.

The above-described layer containing the deposited film composition of the present invention is suitably used as a layer constituting an organic photoelectronic element. Such a layer may, for example, be a charge injection layer or a charge transport layer, and is preferably a charge transport layer, particularly preferably a hole transport layer.

The organic photoelectronic element of the present invention comprises a pair of anode and cathode, and between the pair of electrodes, at least one layer containing the deposited film composition of the present invention (hereinafter sometimes referred to as "the present deposited film layer"). As the anode and the cathode, a known metal, metal oxide or electrically conductive polymer may be used, and they are not particularly limited.

The layer structure of the organic photoelectronic element of the present invention is not particularly limited, and the element may have, between the anode and the cathode, an optional functional layer in addition to the present deposited film layer. For example, the organic photoelectronic element of the present invention may have a pair of electrodes consisting of a transparent electrically conductive electrode and a counter electrode facing the transparent electrically conductive electrode, and between the pair of electrodes, the present deposited film layer and in addition, other layer such as a charge transport layer, a luminous layer or a power generation layer. The material constituting such an optional functional layer is not limited to an organic substance and may be an inorganic substance.

The organic photoelectronic element of the present invention may be produced by forming e.g. an anode or a cathode on a substrate and then forming the above-described layer such as a charge transport layer and the above-described optional functional layer, and then forming e.g. a cathode or an anode.

The method for producing the layer of the present invention is similar to the above-described method for producing the present deposited film layer and is a method of co-depositing the fluorinated polymer and the organic semiconductor material to form the present deposited film layer on the substrate. The co-deposition method is particularly preferably co-disposition method by resistance heating.

The disposition rate in co-deposition (the total deposition rate of the fluorinated polymer and the organic semiconductor material) is not particularly limited and is preferably from 0.001 to 10 nm/s, whereby the surface roughness of the layer such as a charge transport layer is within a predetermined range.

The organic photoelectronic element of the present invention is applicable to an organic photoelectronic device such as an organic EL device, a solar cell, an organic photodiode or an organic laser.

Particularly, the organic photoelectronic element of the present invention is suitably used as an organic EL element. Such an organic EL element is applicable to an organic EL device such as an organic EL display or an organic EL lighting. Such an organic EL device may be top emission type or may be bottom emission type.

The method for sandwiching the layer containing the composition of the present invention between electrodes in an organic photoelectronic device such as an organic EL device is not particularly limited. For example, a co-deposited film formed by co-deposition on an ITO (indium tin oxide) film-provided glass substrate may be mounted on the above device by a known method.

EXAMPLES

Now, the present invention will be described in detail with reference to Examples. However, the present invention is by no means restricted to the following description.

The refractive index, the molecular weight, the intrinsic viscosity, the saturated vapor pressure and the evaporation rate of each of fluorinated copolymers prepared in Examples were measured in accordance with the following description.

Method for Measuring Refractive Index of Fluorinated Polymer

The refractive index was measured in accordance with JIS K7142.

Method for Measuring Mw and Mn of Fluorinated Polymer

The molecular weight of the fluorinated polymer was measured by gel permeation chromatography (GPC). First, a polymethyl methacrylate (PMMA) standard sample having a known molecular weight was subjected to measurement by GPC, and a calibration curve was prepared from the elution time at the peak top and the molecular weight. Then, the fluorinated polymer was subjected to measurement, and Mw and Mn were obtained from the calibration curve. As a mobile phase solvent, 1,1,1,2,3,4,4,5,5,5-decafluoro-3-methoxy-2-(trifluoromethyl)pentane/hexafluoroisopropyl alcohol (85/15 by volume ratio) was used.

Method for Measuring Intrinsic Viscosity [η] of Fluorinated Polymer

The intrinsic viscosity [η] of the fluorinated polymer was measured by an Ubbelohde viscometer (manufactured by SHIBATA SCIENTIFIC TECHNOLOGY LTD., viscometer Ubbelohde) at a measurement temperature of 30° C. using ASAHIKLIN (registered trademark) AC2000 (manufactured by Asahi Glass Company, Limited) as a solvent.

Method for Measuring Elastic Modulus of Fluorinated Polymer

The elastic modulus was measured by rheometer Physica MCR301 manufactured by Anton Paar. The storage modulus Pa and the loss modulus Pa were measured using as a jig PP12 (flat plate, diameter: 12 mm) with a sample thickness of 1 mm at a frequency of 1 Hz by lowering the temperature at a rate of 2° C. per minute from 200° C.

Method of Measuring Saturated Vapor Pressure and Evaporation Rate of Fluorinated Copolymer The saturated vapor pressure and the evaporation rate at 300° C. were measured by using vacuum thermovalance VAP-9000 manufactured by ADVANCE RIKO, Inc. (former ULVAC-RIKO, Inc.).

50 mg of the fluorinated polymer was charged into a cell having an inner diameter of 7 mm and heated at a rate of 2° C. per minute at a degree of vacuum of $1 \times 10^{-3}$ Pa, whereby the evaporation rate g/m$^2$·sec at 300° C. was measured. To calculate the saturated vapor pressure, the evaporation rate and Mw obtained by the above GPC measurement were employed.

The surface roughness, the absorption coefficient and the refractive index of the charge transport layer prepared in Examples were measured, and the J-V characteristics of an element for evaluation of electrical conductivity prepared in Examples were evaluated, in accordance with the following description.

Method of Measuring Surface Roughness of Layer

The surface of a film on a silicon substrate was observed by an AFM (manufactured by Bruker AXS, Dimension Icon) at tapping mode using a probe at a resonance frequency of 300 KHz. The area observed was 0.5 μm square, the obtained image was subjected to height correction in a direction vertical to the probe sweep direction, and then the height RMS value was calculated.

Measurement of Absorption Coefficient of Layer

The absorption coefficient of a film on a quartz substrate was measured by an ultraviolet visible spectrophotometer (manufactured by Shimadzu Corporation, UV-2450), and an absorption spectrum was obtained.

Method for Measuring Refractive Index of Layer

Using a variable angle spectroscopic ellipsometer (manufactured by J.A. Woollam Co., Inc., M-2000U), measurement was conducted on a film on a silicon substrate while the angle of incidence of light was changed every 5° within a range of from 45 to 75°. At each angle, ψ and Δ which are ellipsometry parameters were measured at intervals of about 1.6 nm within a wavelength range of from 450 to 800 nm. Using the above measurement data, the dielectric function of an organic semiconductor was subjected to fitting analysis by Cauchy model, and the refractive index and the extinction coefficient of the layer to light at each wavelength were obtained.

Evaluation of J-V Characteristics of Element for Evaluation of Electrical Conductivity By source meter (manufactured by Keithley, Keithley (registered trademark) 2401), the current flowing in the element for evaluation of electrical conductivity at each voltage was measured while a voltage was applied, taking the ITO (indium tin oxide) side as the anode and the aluminum side as the anode.

Abbreviations of the monomer, solvent and polymerization initiator used for production of the fluorinated polymer are as follows.

BVE: perfluoro(3-butenyl vinyl ether)
BVE-4M: $CF_2$=$CFOCF(CF_3)CF_2CF$=$CF_2$
MMD: perfluoro(4-methyl-2-methylene-1,3-dioxolane)
PDD: perfluoro(2,2-dimethyl-1,3-dioxole)
TFE: tetrafluoroethylene ($CF_2$=$CF_2$)
PPVE: compound ($CF_2$=$CFOCF_2CF_2CF_3$)
1H—PFH: 1,1,1,2,2,3,3,4,4,5,5,6,6-tridecafluorohexane
IPP: diisopropyl peroxydicarbonate Preparation of Fluorinated Polymer A 30 g of BVE, 30 g of 1H—PFH, 0.5 g of methanol and 0.44 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 28 g of fluorinated polymer. The intrinsic viscosity [η] of the obtained fluorinated polymer was 0.04 dl/g.

Then, the unstable terminal group of the obtained fluorinated polymer was substituted by a —$CF_3$ group with fluorine gas by the method disclosed in JP-A-H11-152310, paragraph [0040] to obtain fluorinated polymer A.

Of the obtained fluorinated polymer A, the refractive index to light having a wavelength of 600 nm was 1.34, and the intrinsic viscosity [η] was 0.04 dl/g. Of the fluorinated polymer A, Mw was 9,000, Mn was 6,000, Mw/Mn was 1.5, the saturated vapor pressure at 300° C. was 0.002 Pa, and the evaporation rate at 300° C. was 0.08 g/m$^2$ sec.

Preparation of Fluorinated Polymer B 10 g of BVE, 10 g of 1H—PFH, 0.2 g of methanol and 0.2 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 8 g of fluorinated polymer. The intrinsic viscosity [η] of the obtained fluorinated polymer was 0.04 dl/g.

Then, the obtained fluorinated polymer was heated in an oven at 300° C., immersed in methanol and heated in an oven at 75° C. for 20 hours to substitute the unstable terminal group by a methyl ester group to obtain fluorinated polymer B.

Of the obtained fluorinated polymer B, the refractive index to light having a wavelength of 600 nm was 1.34, Mw was 7,800, Mn was 6,200, Mw/Mn was 1.3, the saturated vapor pressure at 300° C. was 0.003 Pa, and the evaporation rate at 300° C. was 0.06 g/m$^2$ sec.

Preparation of Fluorinated Polymer C 20 g of BVE, 20 g of 1H—PFH, 0.1 g of methanol and 0.3 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 16 g of fluorinated polymer. The intrinsic viscosity [η] of the obtained fluorinated polymer was 0.07 dl/g.

Then, the obtained fluorinated polymer was heated in an oven at 300° C., immersed in methanol and heated in an oven at 75° C. for 20 hours to substitute the unstable terminal group by a methyl ester group to obtain fluorinated polymer C.

Of the obtained fluorinated polymer C, the refractive index to light having a wavelength of 600 nm was 1.34, Mw was 14,000, Mn was 10,100, Mw/Mn was 1.4, the saturated vapor pressure at 300° C. was 0.001 Pa, and the evaporation rate at 300° C. was 0.03 g/m$^2$ sec.

Preparation of Fluorinated Polymer D 450 g of BVE, 600 g of deionized water, 52 g of methanol as a chain transfer agent and 1 g of IPP were put in a glass-lined reactor having an internal capacity of 1 L. The system in the reactor was replaced with nitrogen, and suspension polymerization was carried out at 40° C. for 20 hours and at 50° C. for 6 hours to obtain fluorinated polymer. Particles of the obtained fluorinated polymer were recovered by filtration, washed with methanol and water, and dried at 100° C. to obtain 420 g of fluorinated polymer having terminal groups resulting from BVE and methanol. The intrinsic viscosity [η] of the obtained fluorinated polymer was 0.24 dl/g.

Then, the unstable terminal group of the obtained fluorinated polymer was substituted by a —CF$_3$ group with fluorine gas by the method disclosed in JP-A-H11-152310, paragraph [0040] to obtain fluorinated polymer D.

Of the obtained fluorinated polymer D, the refractive index to light having a wavelength of 600 nm was 1.34, and the intrinsic viscosity [η] was 0.24 dl/g. Of the fluorinated polymer D, Mw was 73,000, Mn was 48,000, Mw/Mn was 1.5, the saturated vapor pressure at 300° C. was 0.0001 Pa, and the evaporation rate at 300° C. was 0.004 g/m$^2$ sec.

Preparation of Fluorinated Polymer E 3 g of MMD, 9 g of 1H—PFH, 0.5 g of methanol and 0.3 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 2 g of fluorinated polymer.

Then, the obtained fluorinated polymer was heated in an oven at 300° C., immersed in methanol and heated in an oven at 75° C. for 20 hours to substitute the unstable terminal group by a methyl ester group to obtain fluorinated polymer E.

Of the obtained fluorinated polymer E, the refractive index to light having a wavelength of 600 nm was 1.33, Mw was 9,800, Mn was 8,100, Mw/Mn was 1.2, the saturated vapor pressure at 300° C. was 0.008 Pa, and the evaporation rate at 300° C. was 0.14 g/m$^2$ sec.

Preparation of Fluorinated Polymer F 2 g of MMD, 6 g of 1H—PFH, 0.4 g of methanol and 0.2 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 1 g of fluorinated polymer.

Then, the obtained fluorinated polymer was heated in an oven at 300° C., immersed in methanol and heated in an oven at 75° C. for 20 hours to substitute the unstable terminal group by a methyl ester group to obtain fluorinated polymer F.

Of the obtained fluorinated polymer F, the refractive index to light having a wavelength of 600 nm was 1.33, Mw was 11,300, Mn was 9,300, Mw/Mn was 1.2, the saturated vapor pressure at 300° C. was 0.007 Pa, and the evaporation rate at 300° C. was 0.10 g/m$^2$ sec.

Preparation of Fluorinated Polymer G 2 g of BVE-4M, 5 g of 1H—PFH, 0.1 g of methanol and 0.03 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 1 g of fluorinated polymer.

Then, the obtained fluorinated polymer was heated in an oven at 300° C., immersed in methanol and heated in an oven at 75° C. for 20 hours to substitute the unstable terminal group by a methyl ester group to obtain fluorinated polymer G.

Of the obtained fluorinated polymer G, the refractive index to light having a wavelength of 600 nm was 1.34, Mw was 10,100, Mn was 8,600, Mw/Mn was 1.2, the saturated vapor pressure at 300° C. was 0.002 Pa, and the evaporation rate at 300° C. was 0.04 g/m$^2$ sec.

Preparation of Fluorinated Polymer H 10 g of BVE-4M, 6 g of 1H—PFH, 0.6 g of methanol and 0.13 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 2 g of fluorinated polymer.

Then, the obtained fluorinated polymer was heated in an oven at 260° C., immersed in methanol and heated in an oven at 75° C. for 20 hours to substitute the unstable terminal group by a methyl ester group to obtain fluorinated polymer H.

Of the obtained fluorinated polymer H, the refractive index to light having a wavelength of 600 nm was 1.34, Mw was 4,500, Mn was 4,000, Mw/Mn was 1.2, the saturated vapor pressure at 300° C. was 0.01 Pa, and the evaporation rate at 300° C. was 0.2 g/m$^2$ sec.

Preparation of Fluorinated Polymer I 1.5 g of BVE, 2 g of PDD, 10 g of 1H—PFH, 0.3 g of methanol and 0.4 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 2 g of fluorinated polymer.

The obtained fluorinated polymer had a composition of BVE units: PDD units=24:76 (mol %).

Then, the obtained fluorinated polymer was heated in an oven at 300° C., immersed in methanol and heated in an oven at 75° C. for 20 hours, and the unstable terminal group was substituted by a methyl ester group to obtain fluorinated polymer I. Of the fluorinated polymer I, the refractive index to light having a wavelength of 600 nm was 1.30, Mw was 9,200, Mn was 8,100, Mw/Mn was 1.1, the saturated vapor pressure at 300° C. was 0.003 Pa, and the evaporation rate at 300° C. was 0.06 g/m$^2$ sec.

Preparation of Fluorinated Polymer J 1.1 g of BVE, 1.5 g of PDD, 7 g of 1H—PFH, 0.1 g of methanol and 0.3 g of IPP were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 1 g of fluorinated polymer.

The obtained fluorinated polymer had a composition of BVE units: PDD units=24:76 (mol %).

Then, the obtained fluorinated polymer was heated in an oven at 300° C., immersed in methanol and heated in an oven at 75° C. for 20 hours, and the unstable terminal group was substituted by a methyl ester group to obtain fluorinated polymer J. Of the fluorinated polymer J, the refractive index to light having a wavelength of 600 nm was 1.30, Mw was 14,100, Mn was 10,700, Mw/Mn was 1.3, the saturated vapor pressure at 300° C. was 0.001 Pa, and the evaporation rate at 300° C. was 0.03 g/m$^2$ sec.

Preparation of Fluorinated Polymer K

Into an stainless steel autoclave having an internal capacity of 1,006 mL, 153 g of PPVE, 805 g of 1H—PFH, 2.4 g of methanol and 1.1 g of 2,2'-azobis(isobutyronitrile) were charged, followed by freeze deaeration with liquid nitrogen. The temperature was increased to 70° C., and TFE was introduced up to 0.57 MPaG. While the temperature and the pressure were kept constant, TFE was continuously supplied to conduct polymerization. 9 hours after initiation of the polymerization, the autoclave was cooled to terminate the polymerization reaction, the gas in the system was purged to obtain a solution of fluorinated polymer.

813 g of methanol was added and mixed to the solution of fluorinated polymer, and a lower layer in which the fluorinated polymer was dispersed was recovered. The obtained dispersion of fluorinated polymer was dried by warm air at 80° C. for 16 hours and then vacuum dried at 100° C. for 16 hours to obtain 19 g of fluorinated polymer.

The obtained fluorinated polymer had a composition of PPVE units: TFE units=6:94 (mol %).

Figure 10:
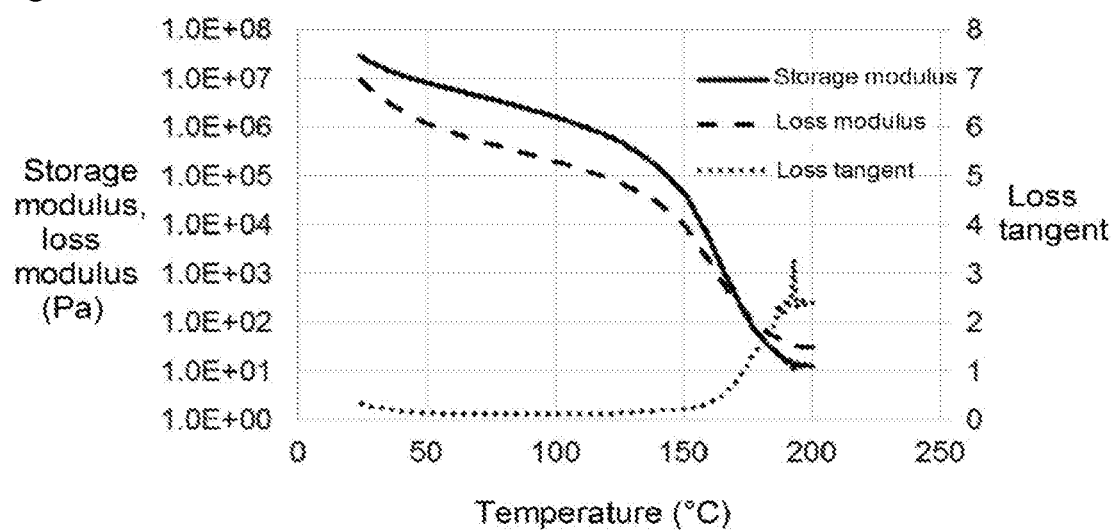
FIG. 10 is a graph illustrating the relation between the elastic modulus and the temperature of polymer K used in Examples.

Then, the obtained fluorinated polymer was heated in an oven at 300° C., immersed in methanol and heated in an oven at 75° C. for 20 hours, and the unstable terminal group was substituted by a methyl ester group to obtain fluorinated polymer K. Since Mw and Mn of the fluorinated polymer K cannot be measured by the above method, instead, the relation between the modulus and the temperature of the fluorinated polymer K is shown in FIG. 10.

Of the obtained fluorinated polymer K, the refractive index to light having a wavelength of 600 nm was 1.34, and the evaporation rate at 300° C. was 0.04 g/m$^2$ sec.

Example 1

Preparation of Charge Transport Layer

Two silicon substrates and one quartz substrate cut into an about 2 cm square were respectively subjected to ultrasonic cleaning with a neutral detergent, acetone and isopropyl alcohol, and further cleaned by boiling in isopropyl alcohol, and then subjected to ozone treatment to remove substances attached to the surface of the substrates. These substrates were respectively placed in a vacuum deposition apparatus, which was evacuated of air to a pressure of at most $10^{-4}$ Pa, and α-NPD and fluorinated polymer A were co-deposited in a volume ratio of α-NPD to fluorinated polymer A of 45:55 by resistance heating in the vacuum deposition apparatus to prepare a charge transport layer having a thickness of about 100 nm on each of the substrates. The total deposition rate of the two materials was 0.2 nm/s. The surface roughness of the obtained charge transport layer was 0.33 nm.

Preparation of Element for Evaluation of Electrical Conductivity

As a substrate to prepare an organic EL element for evaluation, a glass substrate having an ITO (indium tin oxide) film formed in a 2 mm width strip was used. The substrate was subjected to ultrasonic cleaning with a neutral detergent, acetone and isopropyl alcohol and further cleaned by boiling in isopropyl alcohol, and then subjected to ozone treatment to remove substances attached to the ITO film surface. The substrate was placed in a vacuum deposition apparatus, which was evacuated of air to a pressure of at most $10^{-4}$ Pa, and molybdenum trioxide was deposited by resistance heating in the vacuum deposition apparatus at a deposition rate of 0.1 nm/s to form a film of 5 nm as a hole injection layer on the substrate. Then, α-NPD and fluorinated polymer A were co-deposited in a volume ratio of α-NPD to fluorinated polymer A of 45:55 by resistance heating in the vacuum deposition apparatus to form a charge transport layer having a thickness of about 100 nm. The total deposition rate of the two materials was 0.2 nm/s. Further, aluminum was deposited by resistance heating in a 2 mm width strip to obtain an element for evaluation of electrical conductivity. The element area is 2 mm×2 mm at which the 2 mm width ITO and the 2 mm width aluminum intersect with each other.

Examples 2 to 9

A charge transport layer and an element for evaluation of electrical conductivity were prepared in the same manner as in Example 1 except that the fluorinated polymers B to J (excluding D) were used instead of the fluorinated polymer A.

The polymers used in the respective Examples are shown in Table 1.

Example 10

A charge transport layer and an element for evaluation of electrical conductivity were prepared in the same manner as in Example 1 except that the fluorinated polymer K was used instead of the fluorinated polymer A.

Comparative Example 1

A charge transport layer and an element for evaluation of electrical conductivity were prepared in the same manner as in Example 1 except that only α-NPD was deposited on each substrate without using the fluorinated polymer A. The surface roughness of the obtained charge transport layer was 0.22 nm.

Comparative Example 2

A charge transport layer and an element for evaluation of electrical conductivity were prepared in the same manner as in Example 1 except that Teflon (registered trademark) AF1600 (manufactured by DuPont, refractive index to light having a wavelength of 600 nm: 1.32, intrinsic viscosity [η]: 0.88 dl/g, saturated vapor pressure at 300° C.: 0.0001 Pa) as fluorinated polymer was used instead of the fluorinated polymer A. The surface roughness of the obtained charge transport layer was 2.3 nm.

Comparative Example 3

A charge transport layer and an element for evaluation of electrical conductivity were prepared in the same manner as in Example 1 except that the fluorinated polymer D was used instead of the fluorinated polymer A. The surface roughness of the obtained charge transport layer was 1.1 nm.

Measurement Results and their Evaluation

The surface roughnesses (RMS values) of the charge transport layers in Example 1 and Comparative Examples 1, 2 and 3 were respectively 0.33 nm, 0.22 nm, 2.3 nm and 1.1 nm. The difference in the surface roughness is considered to reflect the degree of amorphousness and the degree of heat stability of the fluorinated polymer used. The charge transport layer in Example 1 in which the fluorinated polymer A was used and the charge transport layer in Comparative Example 1 in which it is a single layer of an organic semiconductor containing no fluorinated polymer, were confirmed to have favorable surface smoothness. On the other hand, the charge transport layer in Comparative Example 2 in which Teflon (registered trademark) AF1600 was mixed, had increased surface roughness and impaired smoothness as compared with the charge transport layer in Comparative Example 1 in which no fluorinated polymer was contained. The increase in surface roughness is considered to be due to crystallinity or heat decomposed products of the deposited film of Teflon (registered trademark) AF1600. Further, the charge transport layer in Comparative Example 3 in which the fluorinated polymer D having a high molecular weight was contained, had slightly larger surface roughness as compared with the charge transport layer in Example 1 in which the fluorinated polymer A having a low molecular weight was contained, and this slight increase in the surface roughness is considered to be due to heat decomposed products of the fluorinated polymer D.

The absorption spectrum of each of the charge transport layers in Example 1 and Comparative Examples 1 to 3 is shown in FIG. 1. Each charge transport layer has no absorption and absorption band in a visible range of from 450 nm to 800 nm, and it was found that the light transmission property was not impaired by mixing of the fluorinated polymer.

The dependence of the refractive index on the wavelength of each of the charge transport layers obtained in Examples 1 to 10 and Comparative Examples 1 to 3 is shown in FIGS. 2 to 5. The refractive index of each of the charge transport layers in Examples 1 to 10 and Comparative Examples 2 and 3 at a wavelength of 600 nm was within a range of from 1.51 to 1.56, which was significantly lower than the refractive index (1.78) of the charge transport layer in Comparative Example 1 in which it was a single layer of an organic semiconductor containing no fluorinated polymer.

Mw and Mw/Mn of the fluorinated polymer and the fluorinated polymer in the deposited film in each of Examples 1 to 9 and Comparative Examples 2 and 3 are shown in Table 1.

In Examples 1 to 9, as a deposition material, a fluorinated polymer having a saturated vapor pressure at 300° C. of at least 0.001 Pa was used, Mw of the fluorinated polymer in the deposited film is not significantly different from Mw of the fluorinated polymer, and the dispersity is so small as 1.1, and accordingly, it is considered that heat decomposition during deposition is suppressed, and a homogeneous layer can be formed.

Whereas in Comparative Examples 2 and 3, a fluorinated polymer having a saturated vapor pressure of at most 0.0001 was used as a deposition material, and Mw of the fluorinated polymer in the deposited film is very low molecular weight as compared with Mw of the fluorinated polymer of the deposition material, and the dispersity is 1.3 and the molecular weight distribution is broad as compared with Examples 1 to 9, and accordingly it is considered that heat decomposition occurs during deposition, thermally decomposed products having a low molecular weight are included in the layer, whereby the homogeneity of the layer formed is impaired.

These results indicate that the co-deposited film comprising of the fluorinated film-forming component and the organic semiconductor in each of Examples 1 to 9 can be formed without involving heat decomposition, has a low refractive index required to improve the light-extraction efficiency of an organic EL element and in addition, practical electrical conductivity as well, and that by using such a co-deposited film as a charge transport layer of an organic EL element, the light-extraction efficiency of the element can be remarkably improved without impairing the reliability of the element.

TABLE 1

|  | Fluorinated polymer | Mw of fluorinated polymer | Mw/Mn of fluorinated polymer | Mw of fluorinated polymer in deposited film | Mw/Mn of fluorinated polymer in deposited film | Current density at voltage 7 V [mA/cm$^2$] |
| --- | --- | --- | --- | --- | --- | --- |
| Ex. 1 | A | 10,700 | 1.3 | 6,500 | 1.1 | 187 |
| Ex. 2 | B | 7,800 | 1.3 | 6,200 | 1.1 | 228 |
| Ex. 3 | C | 14,000 | 1.4 | 7,900 | 1.1 | 83 |
| Ex. 4 | E | 9,800 | 1.2 | 7,000 | 1.1 | 175 |
| Ex. 5 | F | 11,300 | 1.2 | 7,200 | 1.1 | 98 |
| Ex. 6 | G | 10,100 | 1.2 | 7,000 | 1.1 | 324 |
| Ex. 7 | H | 4,500 | 1.2 | 3,400 | 1.1 | 241 |
| Ex. 8 | I | 9,200 | 1.1 | 8,200 | 1.1 | 83 |
| Ex. 9 | J | 14,100 | 1.3 | 11,000 | 1.1 | 57 |
| Comp. Ex. 2 | AF1600 | 379,000 | 1.6 | 13,000 | 1.3 | 178 |
| Comp. Ex. 3 | D | 84,100 | 1.4 | 8,900 | 1.3 | 83 |

The J-V characteristics of the element for evaluation of electrical conductivity in each of Examples 1 to 10 and Comparative Examples 1 to 3 are shown in FIGS. 6 to 9. The current density at a voltage of 7 V in each of the elements for evaluation of electrical conductivity in Examples 1 to 10 and Comparative Examples 2 and 3 is at least 40% of the current density of the element for evaluation of electrical conductivity in Comparative Example 1 in which no fluorinated polymer was contained, thus indicating electrical conductivity at the same level as the organic semiconductor material.

INDUSTRIAL APPLICABILITY

The layer containing the composition of present invention can be suitably used for an operation panel or an information display panel of various electronic equipment as an organic EL device and in addition, suitably used also for an organic photoelectronic device, the refractive index of which influences the device characteristics.

This application is a continuation of PCT Application No. PCT/JP2017/044770, filed on Dec. 13, 2017, which is based upon and claims the benefit of priority from Japanese Patent Application No. 2016-242466 filed on Dec. 14, 2016 and Japanese Patent Application No. 2017-161636 filed on Aug. 24, 2017. The contents of those applications are incorporated herein by reference in their entireties.

What is claimed is:

1. A deposited film composition obtained by co-depositing a fluorinated polymer having a saturated vapor pressure at 300° C. of at least 0.001 Pa and an organic semiconductor material, wherein the deposited film composition has a refractive index in a wavelength range of from 450 nm to 800 nm of at most 1.60.

2. The composition according to claim 1, wherein the volume ratio of the fluorinated polymer to the organic semiconductor material is from 70:30 to 5:95.

3. The composition according to claim 1, wherein the fluorinated polymer has a weight average molecular weight of from 1,500 to 50,000.

4. The composition according to claim 1, wherein the dispersity (Mw/Mn) of the fluorinated polymer is at most 2.

5. The composition according to claim 1, wherein the fluorinated polymer has an alicyclic structure in its main chain.

6. The composition according to claim 5, wherein the fluorinated polymer having an alicyclic structure in its main chain is a perfluoropolymer.

7. The composition according to claim 1, wherein the fluorinated polymer has a refractive index in a wavelength range of from 450 nm to 800 nm of at most 1.50.

8. The composition according to claim 1, which has an absorption coefficient in a wavelength range of from 450 nm to 800 nm of at most 1,000 $cm^{-1}$.

9. A method for producing the deposited film composition as defined in claim 1, which comprises co-depositing the fluorinated polymer and the organic semiconductor material.

10. An organic photoelectronic element having a layer comprising the deposited film composition as defined in claim 1.

11. The organic photoelectronic element according to claim 10, wherein the photoelectronic element is an organic EL element.

12. A method for producing a layer of the deposited film composition as defined in claim 1, which comprises co-depositing the fluorinated polymer and the organic semiconductor material on a substrate.

13. A method for producing the organic photoelectronic element as defined in claim 10, which comprises a step of co-depositing the fluorinated polymer and the organic semiconductor material to form the layer of the deposited film composition.

14. The method according to claim 13, wherein the organic photoelectronic element is an organic EL element, and the layer of the deposited film composition is a charge transport layer.

* * * * *